(12) United States Patent
Ding et al.

(10) Patent No.: US 10,942,600 B2
(45) Date of Patent: Mar. 9, 2021

(54) SENSOR PIXEL, ULTRASONIC SENSOR, OLED DISPLAY PANEL, AND OLED DISPLAY DEVICE

(71) Applicant: BOE Technology Group Co., Ltd., Beijing (CN)

(72) Inventors: Xiaoliang Ding, Beijing (CN); Haisheng Wang, Beijing (CN); Yingming Liu, Beijing (CN); Xiaochuan Chen, Beijing (CN); Bo Chen, Beijing (CN); Feiteng Liu, Beijing (CN); Wenhui Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/552,193

(22) Filed: Aug. 27, 2019

(65) Prior Publication Data

US 2020/0348818 A1  Nov. 5, 2020

(30) Foreign Application Priority Data

May 5, 2019 (CN) .......................... 201910366623.3

(51) Int. Cl.
*G06F 3/041* (2006.01)
*G06K 9/00* (2006.01)
*H01L 27/32* (2006.01)

(52) U.S. Cl.
CPC ........ *G06F 3/04164* (2019.05); *G06F 3/0412* (2013.01); *G06K 9/0002* (2013.01); *H01L 27/323* (2013.01)

(58) Field of Classification Search
CPC . G06F 3/0412; G06F 3/04164; G06K 9/0002; H01L 27/323
See application file for complete search history.

(56) References Cited

U.S. PATENT DOCUMENTS

| | | | | |
|---|---|---|---|---|
| 2013/0265262 A1* | 10/2013 | Jung | ..................... | G06F 1/1652 |
| | | | | 345/173 |
| 2019/0204868 A1* | 7/2019 | Choi | ..................... | G06F 3/0488 |
| 2019/0250752 A1* | 8/2019 | Shim | ..................... | G06F 1/1637 |
| 2019/0268462 A1* | 8/2019 | Yim | ..................... | G06F 1/1643 |
| 2019/0302939 A1* | 10/2019 | Hong | ..................... | G06F 3/0412 |
| 2019/0318073 A1* | 10/2019 | Lee | ..................... | G06F 21/45 |
| 2020/0150828 A1* | 5/2020 | Kim | ..................... | G06F 3/0488 |
| 2020/0159358 A1* | 5/2020 | Hong | ..................... | G01L 1/142 |
| 2020/0160018 A1* | 5/2020 | Panchawagh | ....... | H01L 41/1134 |
| 2020/0167026 A1* | 5/2020 | Lee | ..................... | G06F 3/044 |

* cited by examiner

*Primary Examiner* — Tony O Davis
(74) *Attorney, Agent, or Firm* — Muncy, Geissler, Olds and Lowe, P.C.

(57) ABSTRACT

The present disclosure provides a sensor pixel, an ultrasonic sensor, an OLED display panel and an OLED display device, in which the sensor pixel includes a base substrate, a piezoelectric transducer and a sensor pixel circuit arranged on the base substrate; the energy sensor is connected to a first signal input terminal and the first node; the sensor pixel circuit includes a signal node control subcircuit for controlling the first node according to a signal of the reset signal terminal and a signal of the second signal input terminal, a drive subcircuit for providing a detection signal to the second node under the control of a signal of the first node, and a read subcircuit for providing a signal of the second node to the signal read line under the control of the read signal terminal.

19 Claims, 8 Drawing Sheets

SENSOR PIXEL, ULTRASONIC SENSOR, OLED DISPLAY PANEL, AND OLED DISPLAY DEVICE

CROSS-REFERENCE TO RELATED APPLICATION

This application claims a priority to Chinese Patent Application No. 201910366623.3 filed on May 5, 2019, the disclosures of which are incorporated in their entirety by reference herein.

TECHNICAL FIELD

The present disclosure relates to the field of display technology, in particular, to a sensor pixel, an ultrasonic sensor, an OLED display panel, and an OLED display device.

BACKGROUND

A fingerprint is a feature of the human body that is inherently unique and is able to distinguish one from the others. It is composed of a series of valleys and ridges on the skin, and the fingerprint recognition technology developed thereby is an technology used as a personal authentication from early on. With the development of display technology, the fingerprint recognition technology has become an important direction, and the current common implementation methods are capacitive sensing, optical detection, pressure sensing or ultrasonic detection. The ultrasonic detection method has received more and more attention because of its advantages of no contact, no occlusion, and high precision.

According to the research by the inventors, the sensor pixel used for ultrasonic fingerprint recognition in the related art uses a diode to rectify an electrical signal generated by receiving the reflected ultrasonic wave. Since one side of the diode is doped into a P type and the other side of the diode is doped into an N type, the process for manufacturing the sensor pixel is complicated and its cost is relatively high.

SUMMARY

In order to solve the above technical problems, the present disclosure provides a sensor pixel, an ultrasonic sensor, an OLED display panel, and an OLED display device.

Some embodiments of the present disclosure provide a sensor pixel, which includes a base substrate, a piezoelectric transducer arranged on the base substrate, and a sensor pixel circuit, wherein the piezoelectric transducer is connected to a first signal input terminal and a first node, the sensor pixel circuit includes a node control subcircuit, a drive subcircuit and a read subcircuit; the node control subcircuit is connected to the first node, a reset signal terminal and a second signal input terminal, and is configured to control a signal of the first node according to a signal of the reset signal terminal and a signal of the second signal input terminal; the drive subcircuit is connected to the first node, a power terminal and a second node, and is configured to provide a detection signal to the second node under the control of the signal of the first node; and the read subcircuit is connected to the second node, a read signal terminal and a signal read line, and is configured to provide a signal of the second node to the signal read line under the control of the read signal terminal.

In one example, the piezoelectric transducer includes a first electrode, a second electrode, and a piezoelectric material layer arranged between the first electrode and the second electrode; and the first electrode of the piezoelectric transducer is connected to the first signal input terminal, and the second electrode of the piezoelectric transducer is connected to the first node.

In one example, the piezoelectric material layer includes polyvinyldifluoride (PVDF), aluminum nitride (AlN), or a lead zirconate titanate based composite oxide of a perovskite structure.

In one example, the first electrode and the second electrode of the piezoelectric transducer are of a multilayer conductive structure, each of which includes: a first metal layer made of titanium or molybdenum, a second metal layer made of aluminum, and a third metal layer made of titanium or molybdenum, the first metal layer is located on a side proximate to the base substrate, and the third metal layer is arranged between the first metal layer and the second metal layer.

In one example, the node control subcircuit includes a first switching transistor and is not provided with a diode; and a control electrode of the first switching transistor is connected to the reset signal terminal, a first electrode of the first switching transistor is connected to the second signal input terminal, and a second electrode of the first switching transistor is connected to the first node.

In one example, the node control subcircuit includes a first switching transistor and a capacitor, and is not provided with a diode; a control electrode of the first switching transistor is connected to the reset signal terminal, a first electrode of the first switching transistor is connected to the second signal input terminal, and a second electrode of the first switching transistor is connected to the first node; and a first terminal of the capacitor is connected to the second signal input terminal, and a second terminal of the capacitor is connected to the first node.

In one example, the node control subcircuit includes a first switching transistor and a second switching transistor, and is not provided with a diode; a control electrode of the first switching transistor is connected to the reset signal terminal, a first electrode of the first switching transistor is connected to the second signal input terminal, and a second electrode of the first switching transistor is connected to the first node; and a control electrode and a first electrode of the second switching transistor are connected to the second signal input terminal, and a second electrode of the second switching transistor is connected to the first node.

In one example, the drive subcircuit includes a drive transistor; a control electrode of the drive transistor is connected to the first node, a first electrode of the drive transistor is connected to the power terminal, and a second electrode of the drive transistor is connected to the second node; the read subcircuit includes a third switching transistor; and a control electrode of the third switching transistor is connected to the read signal terminal, a first electrode of the third switching transistor is connected to the second node, and a second electrode of the third switching transistor is connected to the signal read line.

In one example, the sensor pixel further includes a first insulating layer arranged on the base substrate, wherein the first insulating layer is arranged on a side of the second electrode of the piezoelectric transducer proximate to the sensor pixel circuit, the first insulating layer is provided with a first via hole, and the second electrode of the piezoelectric transducer is connected to the sensor pixel circuit through the first via hole.

In one example, the sensor pixel further includes a shielding layer and a second insulating layer; the shielding layer is arranged on a side of the first insulating layer away from the second electrode of the piezoelectric transducer; and the second insulating layer is arranged on a side of the shielding layer away from the second electrode of the piezoelectric transducer; and the shielding layer is provided with a second via hole, the second insulating layer is provided with a third via hole, and the second electrode of the piezoelectric transducer is connected to the sensor pixel circuit through the first via hole, the second via hole and the third via hole.

In one example, the shielding layer includes a first conductive layer and a second conductive layer; and the first conductive layer is arranged on a side of the second conductive layer proximate to the second insulating layer.

In one example, the second insulating layer includes an organic material, the first conductive layer includes a transparent conductive material, and the second conductive layer includes a low-resistance metal material.

In one example, a resistivity of the second conductive layer is smaller than a resistivity of the first conductive layer.

In one example, the second conductive layer is of a mesh structure; and an orthogonal projection of the second conductive layer on the base substrate does not overlap an orthogonal projection of the second via hole on the base substrate.

Some embodiments of the present disclosure also provide an ultrasonic sensor including the above sensor pixel.

Some embodiments of the present disclosure also provide an OLED display panel including the above ultrasonic sensor.

Some embodiments of the present disclosure also provide an OLED display device including the above OLED display panel.

Other features and advantages of the present disclosure will be set forth in the description which follows, and some will be obvious from the description, or learned by implementing embodiments of the present disclosure. The objectives and other advantages of the present disclosure can be realized and obtained by the structure particularly set forth in specification, drawings, and claims.

BRIEF DESCRIPTION OF THE DRAWINGS

The drawings described herein are intended to provide a further understanding of the technical solutions of the present disclosure, and constitute a part of this disclosure. They together with the embodiments of the present disclosure are intended to illustrate the technical solutions of the present disclosure, and do not constitute a limitation of the technical solutions of the present disclosure.

DETAILED DESCRIPTION

Figure 1:
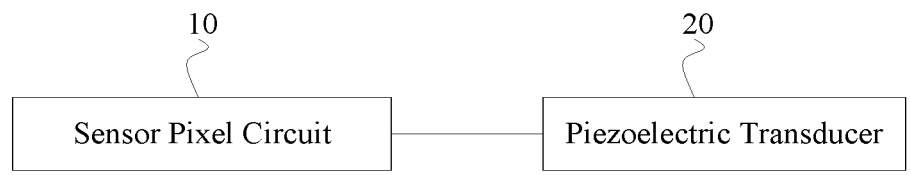
FIG. 1 is a schematic view showing the structure of a sensor pixel according to an embodiment of the present disclosure.

In order to illustrate the purposes, technical solutions and advantages of the present disclosure in a clearer manner, the embodiments of the present disclosure will be described in detail hereinafter in conjunction with the drawings. It should be noted that the embodiments in the disclosure and the features in the embodiments can be arbitrarily combined with each other, as long as they do not contradict with each other.

The steps illustrated in the flowchart of the drawings may be executed in a computer system such as a set of computer executable instructions. Also, although logical sequences are shown in the flowcharts, in some cases, the steps shown or described may be executed in an order different from that described herein.

Unless otherwise defined, technical terms or scientific terms used in the embodiments of the present disclosure have the normal meaning commonly understood by one skilled in the art in the field of the present disclosure. The words "first", "second", and the like used in the embodiments of the present disclosure do not denote any order, quantity, or importance, but rather merely serves to distinguish different components. The words "including", "comprising", and the like used in the present disclosure means that the element or item appeared in front of the word encompasses the element or item and their equivalents listed after the word, and does exclude other elements or items. The words "connected" or "connecting" and the like are not limited to physical or mechanical connections, but may also include electrical connections, whether direct or indirect. "On", "under", "left", "right" and the like are only used to represent relative positional relationships, and when the absolute position of the described object is changed, the relative positional relationship may also be changed, accordingly.

One skilled in the art will appreciate that the transistor used in all embodiments of the present disclosure may be a thin-film transistor or field-effect transistor, or other devices having the same characteristics. Preferably, the thin-film transistor used in the embodiment of the present disclosure may be an oxide semiconductor transistor. Since the source electrode and drain electrode of the transistor used herein are symmetrical, the source electrode and drain electrode thereof can be interchanged. In the embodiment of the present disclosure, in order to distinguish the two electrodes, other than the gate electrode, of the transistor, one of the electrodes is referred to as a first electrode, and the other electrode is referred to as a second electrode, in which the first electrode may be a source electrode or a drain electrode, and the second electrode may be a source electrode or a drain electrode. In addition, a gate electrode of the transistor becomes the control electrode.

Embodiments of the present disclosure provide a sensor pixel, an ultrasonic sensor, an OLED display panel, and an OLED display device, in which the sensor pixel includes a base substrate, a piezoelectric transducer arranged on the base substrate, and a sensor pixel circuit; the piezoelectric transducer is connected to a first signal input terminal and a first node; the sensor pixel circuit includes a node control subcircuit, a drive subcircuit and a read subcircuit; the node control subcircuit is connected to the first node, a reset signal terminal and a second signal input terminal, and is configured to control a signal of the first node according to a signal of the reset signal terminal and a signal of the second signal input terminal; the drive subcircuit is connected with the first node, the power terminal and a second node, and is configured to provide a detection signal to the second node under the control of the signal of the first node; and the read subcircuit is connected with the second node, a read signal terminal and a signal read line, and is configured to provide a signal of the second node to the signal read line under the control of the read signal terminal. Therefore, the technical solution provided by the present disclosure simplifies the process for manufacturing the sensor pixel, and also reduces the cost of the sensor pixel.

Embodiment 1

Figure 2:
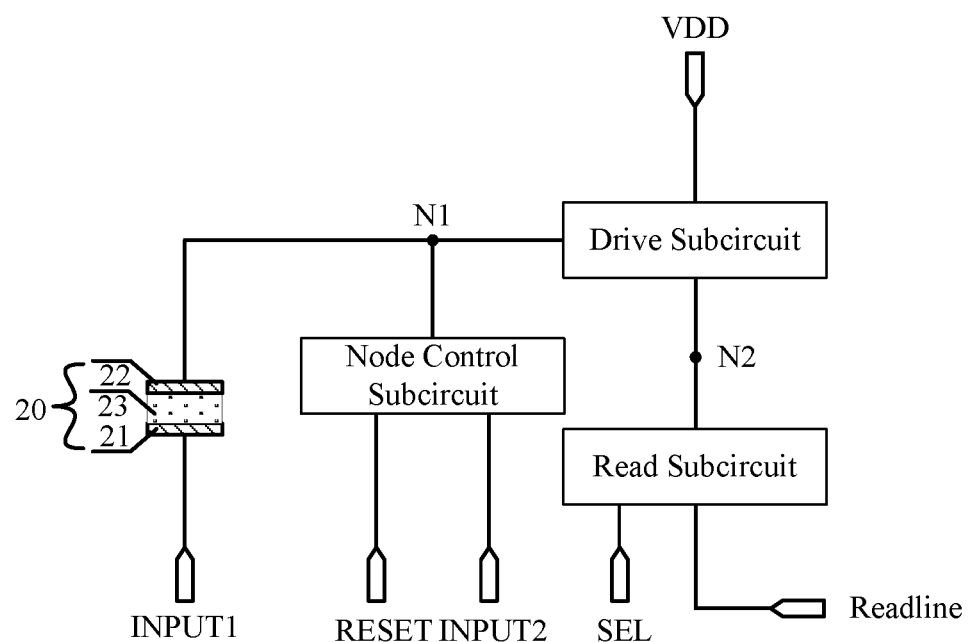
FIG. 2 is a schematic view showing the structure of a sensor pixel circuit according to an embodiment of the present disclosure.

The embodiment of the present disclosure provides a sensor pixel. FIG. 1 is a schematic view showing the structure of a sensor pixel according to an embodiment of the present disclosure. FIG. 2 is a schematic view showing the structure of a sensor pixel circuit according to an embodiment of the present disclosure. As shown in FIGS. 1 and 2, the sensor pixel provided by the embodiment of the present disclosure includes: a base substrate (not shown), a sensor pixel circuit 10 arranged on the base substrate, and a piezoelectric transducer 20, in which the piezoelectric transducer 20 is connected to the first signal input terminal INPUT1 the first node N1, and the sensor pixel circuit 10 includes a node control subcircuit, a drive subcircuit, and a read subcircuit.

Specifically, the node control subcircuit is connected to the first node N1, a reset signal terminal RESET and a second signal input terminal INPUT2, and is configured to control a signal of the first node N1 according to a signal of the reset signal terminal RESET and a signal of the second signal input terminal INPUT2; the drive subcircuit is connected with the first node N1, the power terminal VDD and a second node N2, and is configured to provide a detection signal to the second node N2 under the control of the signal of the first node N1; and the read subcircuit is connected with the second node N2, a read signal terminal SEL and a signal read line Readline, and is configured to provide a signal of the second node N2 to the signal read line Readline under the control of the read signal terminal SEL.

Optionally, the base substrate may be a rigid substrate or a flexible substrate, in which the rigid substrate may be, but not limited to, one or more selected from glass and metal foil, and the flexible substrate may be, but not limited to, one or more selected from polyethylene terephthalate, polyethylene terephthalate, polyetheretherketone, polystyrene, polycarbonate, polyarylate, polyimide, polyvinyl chloride, polyethylene, and textile fibers.

In this embodiment, the piezoelectric transducer 20 is configured to emit ultrasonic wave and convert the reflected ultrasonic signal into an electrical signal, and the sensor pixel circuit 10 is configured to process the electrical signal converted by the piezoelectric transducers 20, so as to detect a fingerprint image.

Figure 3:
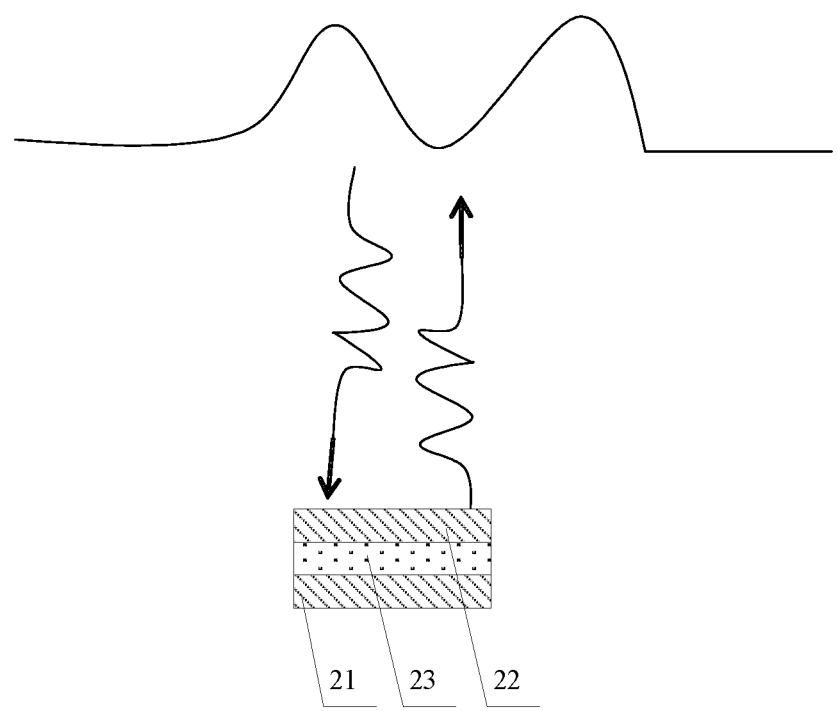
FIG. 3 is a schematic view showing the operation of the piezoelectric transducer.

For example, FIG. 3 is a schematic view showing the operation of the piezoelectric transducer. As shown in FIG. 3, the piezoelectric transducer 20 includes a first electrode 21, a second electrode 22, and a piezoelectric material layer 23.

Among them, the first electrode 21 of the piezoelectric transducer 20 is connected to the first signal input terminal INPUT1, and the second electrode 22 of the piezoelectric transducer 20 is connected to the first node N1.

Optionally, the first electrode 21 and the second electrode 22 of the piezoelectric transducer 20 are not limited as long as they are electrically conductive. For example, they can be made of a metal material, such as platinum, rhodium, gold, aluminum, copper, titanium, or stainless steel, or tin oxide-based conductive material, such as indium tin oxide or fluorine-doped tin oxide. Further, they can be of a multilayer conductive structure including a first metal layer, a second metal layer, and a third metal layer, in which the first metal layer may be made of titanium or molybdenum, the second metal layer may be made of aluminum, and the third metal layer may be made of titanium or molybdenum; and the first metal layer is located on a side proximate to the base substrate, and the third metal layer is arranged between the first metal layer and the second metal layer. The embodiments of the present disclosure do not have any limitation on the material and structure of the first electrode and the second electrode of the piezoelectric transducer.

Optionally, the piezoelectric material layer 23 may include polyvinylidene fluoride (PVDF), aluminum nitride (AlN), or a lead zirconate titanate based composite oxide of a perovskite structure, which is not limited in the embodiments of the present disclosure.

For example, as shown in FIG. 3, the operating principle of the piezoelectric transducer 20 is to apply a high-voltage sine wave signal to the first electrode 21. At this time, a fixed voltage is applied to the second electrode 22, and then the piezoelectric material layer 23 generates a reverse piezoelectric effect due to the voltage excitation and emits ultrasonic wave outward. The emitted ultrasonic wave contacts the object, such as a finger. Since the fingerprint has valleys and ridges, the vibration intensities of the reflected ultrasonic waves will be different. At this time, a fixed voltage is applied to the first electrode 21, and then the piezoelectric material layer 23 is affected by the reflected ultrasonic wave to generate a positive piezoelectric effect and generates an AC voltage signal on the second electrode 22.

Similarly, it should be noted that, in addition to being applicable to the fingerprint recognition mentioned in the embodiments of the present disclosure, the piezoelectric transducer can also recognize the touch position of the finger, in which the echo wave at the position of the touch is relatively small, and the echo wave at the position of no touch is relatively strong.

It should be noted that the piezoelectric transducer may further include a piezoelectric matching layer for changing the ultrasonic transmission path, which is not limited in the embodiments of the present disclosure.

The sensor pixel provided by the embodiments of the invention includes a base substrate, a piezoelectric transducer arranged on the base substrate, and a sensor pixel circuit; the piezoelectric transducer is connected to a first signal input terminal and a first node; the sensor pixel circuit includes a node control subcircuit, a drive subcircuit and a read subcircuit; the node control subcircuit is connected to the first node, a reset signal terminal and a second signal input terminal, and is configured to control a signal of the first node according to a signal of the reset signal terminal and a signal of the second signal input terminal; the drive subcircuit is connected with the first node, the power terminal and a second node, and is configured to provide a detection signal to the second node under the control of the signal of the first node; and the read subcircuit is connected with the second node, a read signal terminal and a signal read line, and is configured to provide a signal of the second node to the signal read line under the control of the read signal terminal. The technical solution provided by the embodiments of the present disclosure simplifies the process for manufacturing the sensor pixel, and also reduces the cost of the sensor pixel.

Figure 4:
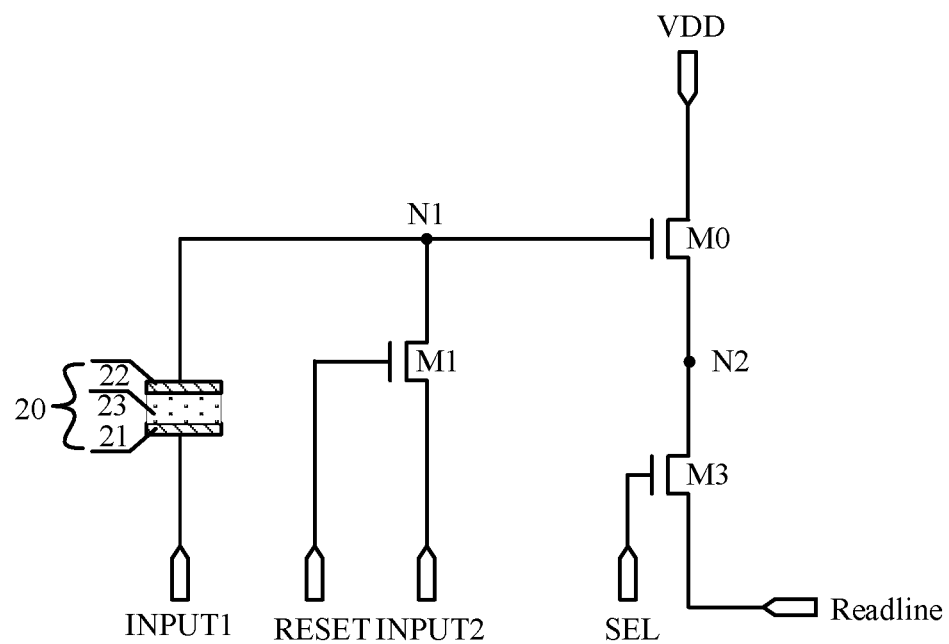
FIG. 4 is an equivalent circuit diagram I showing a sensor pixel circuit according to an embodiment of the present disclosure.

Optionally, FIG. 4 is an equivalent circuit diagram I showing a sensor pixel circuit according to an embodiment of the present disclosure. As shown in FIG. 4, the node control subcircuit in the sensor pixel circuit provided by the embodiments of the present disclosure includes a first switching transistor M1, the drive subcircuit includes a drive transistor M0, and the read subcircuit includes a third switching transistor M3.

Specifically, a control electrode of the first switching transistor M1 is connected to the reset signal terminal RESET, a first electrode of the first switching transistor M1 is connected to the second signal input terminal INPUT2, and a second electrode of the first switching transistor M1 is connected to the first node N1; a control electrode of the drive transistor M0 is connected to the first node N1, a first electrode of the drive transistor M0 is connected to the power terminal VDD, and a second electrode of the drive transistor M0 is connected to the second node N2; and a control electrode of the third switching transistor M3 is connected to the read signal terminal SEL, a first electrode of the third switching transistor M3 is connected to the second node N2, and a second electrode of the third switching transistor M3 is connected to the signal read line Readline.

In the present embodiment, FIG. 4 specifically shows an exemplary structure of the node control subcircuit, the drive subcircuit and the read subcircuit. One skilled in the art will readily understand that the implementation of the node control subcircuit, the drive subcircuit and the read subcircuit is not limited thereto as long as the function can be realized.

In this embodiment, the transistors M0, M1 and M3 can all be N-type thin-film transistors or P-type thin-film transistors, and thus the process flow can by unified, thereby be capable of simplifying the process flow, and be conducive to improving the yield of the product.

In the sensor pixel circuit of sensor pixel provided by embodiment of the present disclosure, the subcircuit configured to control the potential of the first node is not provided with a diode, but is merely composed of a transistor, which not only simplifies the process for manufacturing the sensor pixel, but also reduces the cost of the sensor pixel.

The technical solution of the embodiment of the present disclosure will be further illustrated below by the working process of the sensor pixel circuit.

Figure 5:
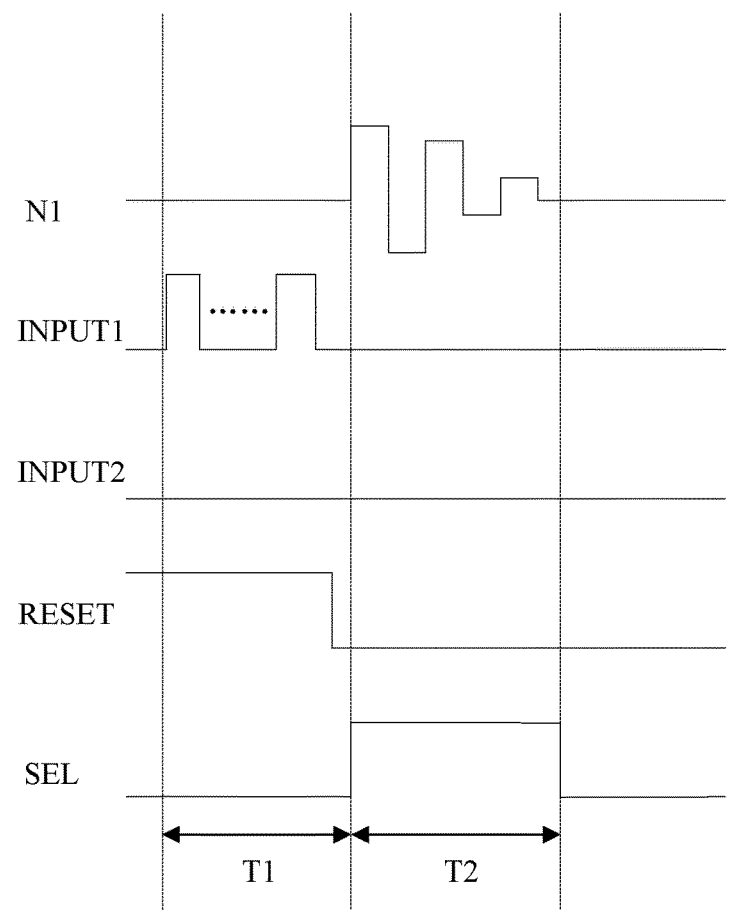
FIG. 5 is a timing chart showing the operation of the sensor pixel circuit provided in FIG. 4.

As an example, the transistors M0 to M2 in the sensor pixel circuit provided by the embodiment of the present disclosure are all N-type thin-film transistors. FIG. 5 is a timing chart showing the operation of the sensor pixel circuit provided in FIG. 4. As shown in FIGS. 4 to 5, the sensor pixel circuit involved in the embodiments of the present disclosure includes: two switching transistors (M1 and M3), one drive transistor (M0), three signal input terminals (RESET, INPUT2, and SEL), and one power terminal (VDD).

In the first stage T1 which is an emitting phase, the input signal of the reset signal terminal RESET is at a high level. The first switching transistor M1 is turned on under the control of the reset signal terminal RESET, and the signal of the second signal input terminal INPUT2 is provided to the first node N1, such that the second electrode 22 of the piezoelectric transducer 20 is loaded with a fixed voltage. The input signal of the first signal input terminal INPUT1 is an AC voltage, such that the first electrode 21 of the piezoelectric transducer 20 is loaded with an AC voltage. As the first electrode 21 is loaded with an AC voltage and the second electrode 22 is loaded with a fixed voltage, the piezoelectric material layer 23 generates an ultrasonic signal.

Optionally, the AC signal may be a square wave AC signal, or may be a sinusoidal AC signal, and the frequency is 100 kHz to 20 MHz. FIG. 5 is an example in which the AC signal is a square wave AC signal.

For example, the voltage value of the signal of the second signal input terminal INPUT2 is VSL, and VSL is 0V to 5V. It should be noted that, at this stage, the potential of the first node N1 is always controlled to be VSL.

In the second stage T2 which is a receiving phase, the input signal of the reset signal terminal RESET is at a low level. The first switching transistor M1 is turned off under the control of the reset signal terminal RESET, and the input signal of the first signal input terminal INPUT1 is a fixed voltage, such that the first electrode 21 of the piezoelectric transducer 20 is loaded with a fixed voltage. At this time, the piezoelectric material layer 23 receives the ultrasonic signal. An AC signal is generated on the second electrode 22 due to the positive piezoelectric effect of the piezoelectric material layer 23. When the AC signal is at a high level, the drive transistor M0 is turned on. When the AC signal is at a low level, the drive transistor M0 is turned off, the input signal of the read signal terminal SEL is at a high level, the third switching transistor M3 is turned on, and a source signal of the drive transistor M0 is provided to the signal read line Readline, to determine the fingerprint information by the external detecting unit based on the electrical signal in the signal read line.

It should be noted that the sensor pixel circuit provided in FIG. 4 determines a fingerprint signal in a manner of AC detection.

Figure 6:
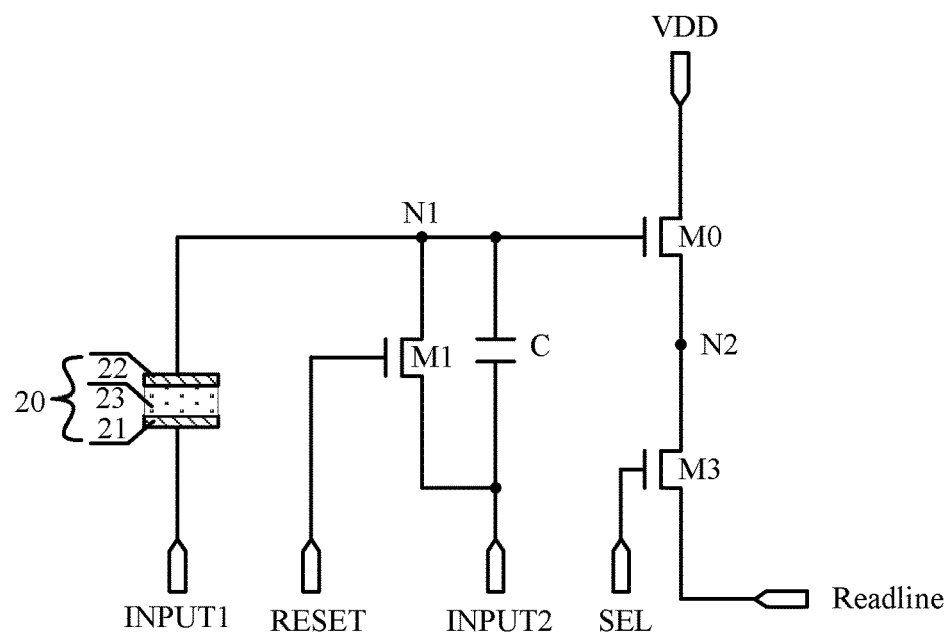
FIG. 6 is an equivalent circuit diagram II showing a sensor pixel circuit according to an embodiment of the present disclosure.

Optionally, the sensor pixel circuit can determine a fingerprint information in a manner of DC detection. To ensure that the sensor pixel circuit can determine the fingerprint information in a manner of DC detection, FIG. 6 is an equivalent circuit diagram II showing a sensor pixel circuit according to an embodiment of the present disclosure. As shown in FIG. 6, the node control subcircuit in the sensor pixel circuit provided by the embodiments of the present disclosure includes a first switching transistor M1 and a capacitor C, the drive subcircuit includes a drive transistor M0, and the read subcircuit includes a third switching transistor M3.

For example, the control electrode of the first switching transistor M1 is connected to the reset signal terminal RESET, a first electrode of the first switching transistor M1 is connected to the second signal input terminal INPUT2, a second electrode of the first switching transistor M1 is connected to the first node N1; a first terminal of the capacitor C is connected to the second signal input terminal INPUT2, and a second terminal of the capacitor C is connected to the first node N1; a control electrode of the drive transistor M0 is connected to the first node N1, a first electrode of the drive transistor M0 is connected to the power terminal VDD, and a second electrode of the drive transistor M0 is connected to the second node N2; and a control electrode of the third switching transistor M3 is connected to the read signal terminal SEL, a first electrode of the third switching transistor M3 is connected to the second node N2, and a second electrode of the third switching transistor M3 is connected to the signal read line Readline.

In the present embodiment, FIG. 6 specifically shows an exemplary structure of the node control subcircuit, the read subcircuit, and the drive subcircuit. One skilled in the art will readily understand that the implementation of the node control subcircuit is not limited thereto as long as the function can be realized.

In the sensor pixel circuit of sensor pixel provided by embodiment of the present disclosure, the subcircuit configured to control the potential of the first node is not provided with a diode, but is merely composed of a transistor and a capacitor, which not only simplifies the process for manufacturing the sensor pixel, but also reduces the cost of the sensor pixel.

The technical solution of the embodiment of the present disclosure is further illustrated by the working process of the sensor pixel circuit.

Figure 7:
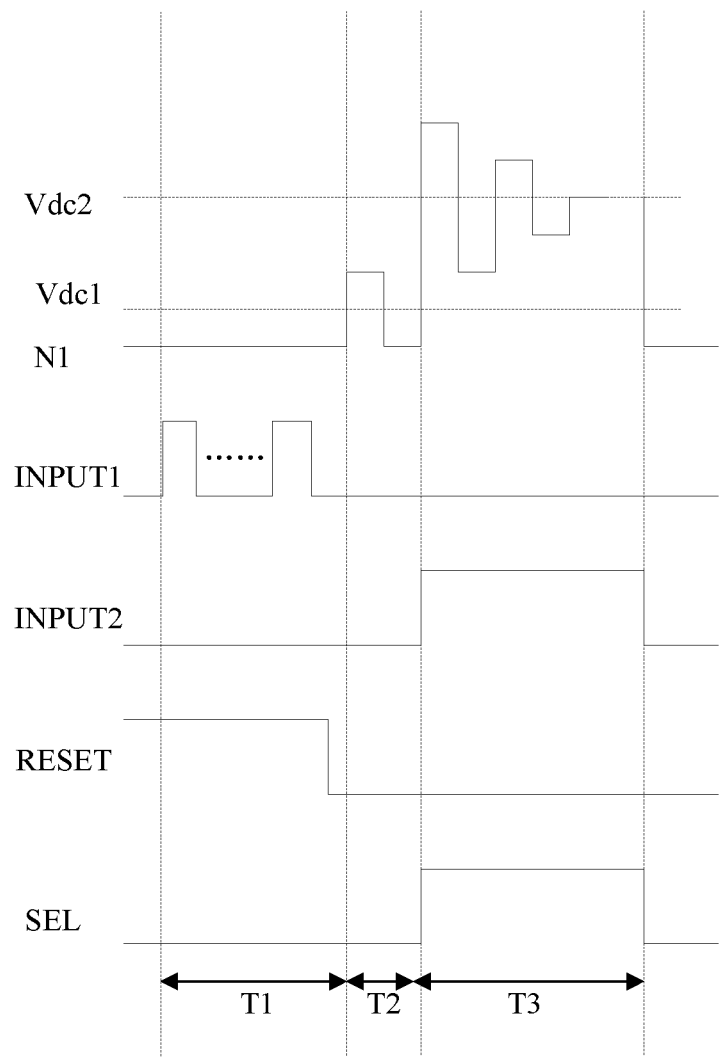
FIG. 7 is a timing chart showing the operation of the sensor pixel circuit provided in FIG. 6.

As an example, the transistors M0, M1 and M3 in the sensor pixel circuit provided by the embodiment of the present disclosure are all N-type thin-film transistors. FIG. 7 is a timing chart showing the operation of the sensor pixel circuit provided in FIG. 6. As shown in FIGS. 6 to 7, the sensor pixel circuit involved in the embodiments of the present disclosure includes: two switching transistors (M1 and M3), one drive transistor (M0), one capacitor unit (C), three signal input terminals (RESET, INPUT2, and SEL), and one power terminal (VDD).

Specifically, in the first stage T1 which is an emitting phase, the input signal of the reset signal terminal RESET is at a high level. The first switching transistor M1 is turned on under the control of the reset signal terminal RESET, and the signal of the second signal input terminal INPUT2 is provided to the first node N1, such that the second electrode 22 of the piezoelectric transducer 20 is loaded with a fixed voltage. The input signal of the first signal input terminal INPUT1 is an AC voltage, such that the first electrode 21 of the piezoelectric transducer 20 is loaded with an AC voltage. As the first electrode 21 is loaded with an AC voltage and the second electrode 22 is loaded with a fixed voltage, the piezoelectric material layer 23 generates an ultrasonic signal.

Optionally, the AC signal may be a square wave AC signal, or may be a sinusoidal AC signal, and the frequency is 100 kHz to 20 MHz. FIG. 7 is an example in which the AC signal is a square wave AC signal.

For example, the voltage value of the signal of the second signal input terminal INPUT2 is VSL, and VSL is 0V to 5V. It should be noted that, at this stage, the potential of the first node N1 is always controlled to be VSL.

In the second stage T2 which is a receiving phase, the input signal of the reset signal terminal RESET is at a low level. The first switching transistor M1 is turned off under the control of the reset signal terminal RESET, and the input signal of the first signal input terminal INPUT1 is a fixed voltage, such that the first electrode 21 of the piezoelectric transducer 20 is loaded with a fixed voltage. At this time, the piezoelectric material layer 23 receives the ultrasonic signal.

An AC signal is generated on the second electrode 2 due to the positive piezoelectric effect of the piezoelectric material layer 23. When the AC signal is at a high level, the AC signal is charged to the capacitor C. When the AC signal is at a low level, the capacitor C is discharged, to ensure that the signal of the first node N1 is a single direction DC signal. At this time, it is assumed that the amplitude of the AC signal is Vdata, the DC level of the first node N1 satisfies Vdc1=VSL+½Vdata, and the drive transistor M0 is in an off state.

In the third stage T3 which is a reading phase, the input signal of the second signal input terminal INPUT2 jumps, such that the potential of the signal jumps from VSL to VSH, in which VSH>VSL. Due to the effect of the capacitor C, the potential of the first node N1 jumps accordingly. At this time, the DC level of the first node N1 satisfies Vdc2=(VSH−VSL)+VSL+½Vdata=VSH+½Vdata. At this time, the drive transistor M0 is turned on. The input signal of the read signal terminal SEL is at a high level, the third switching transistor M3 is turned on, and a source signal of the drive transistor M0 is provided to the signal read line Readline, to determine the fingerprint information by the external detecting unit based on the electrical signal in the signal read line.

In the embodiment of the present disclosure, in order to reduce power consumption, in the first phase T1 and the second phase T2, the drive transistor M0 is in an off state. In the second phase T2 and the third phase T3, since the ultrasonic signal has stopped emitting, the AC signal generated by the second electrode 22 will gradually become smaller and smaller due to the damping effect, and finally the potential of the first node N1 will be equal to Vdc2. Since Vdc2 includes Vdata, Vdata reflects the amplitude of the AC signal, and the amplitude of the AC signal depends on the fingerprint information, the purpose of fingerprint detection can be achieved by the detection of Vdc2.

Figure 8:
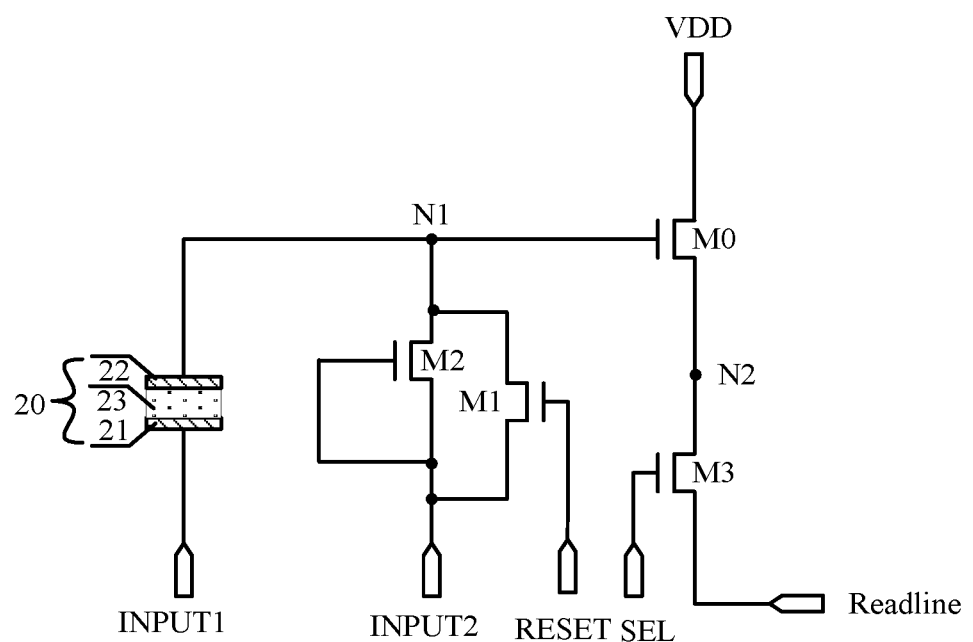
FIG. 8 is an equivalent circuit diagram III showing a sensor pixel circuit according to an embodiment of the present disclosure.

Optionally, FIG. 8 is an equivalent circuit diagram III showing a sensor pixel circuit according to an embodiment of the present disclosure. As shown in FIG. 8, the node control subcircuit in the sensor pixel circuit provided by the embodiments of the present disclosure includes a first switching transistor M1 and a second switching transistor M2, the drive subcircuit includes a drive transistor M0, and the read subcircuit includes a third switching transistor M3.

Specifically, the control electrode of the first switching transistor M1 is connected to the reset signal terminal RESET, a first electrode of the first switching transistor M1 is connected to the second signal input terminal INPUT2, and a second electrode of the first switching transistor M1 is connected to the first node N1; a control electrode and a first electrode of the second switching transistor M2 is connected to the second signal input terminal INPUT2, and a second electrode of the second switching transistor M2 is connected to the first node N1; a control electrode of the drive transistor M0 is connected to the first node N1, a first electrode of the drive transistor M0 is connected to the power terminal VDD, and a second electrode of the drive transistor M0 is connected to the second node N2; and a control electrode of the third switching transistor M3 is connected to the read signal terminal SEL, a first electrode of the third switching transistor M3 is connected to the second node N2, and a second electrode of the third switching transistor M3 is connected to the signal read line Readline.

In the present embodiment, FIG. 8 specifically shows an exemplary structure of the node control subcircuit, the read subcircuit, and the drive subcircuit. One skilled in the art will readily understand that the implementation of the node control subcircuit is not limited thereto as long as the function can be realized.

In this embodiment, the transistors M0 to M3 can all be N-type thin-film transistors or P-type thin-film transistors, and thus the process flow of the transistors M0 to M3 can by unified, thereby be capable of simplifying the process flow, and be conducive to improving the yield of the product.

In the sensor pixel circuit in sensor pixel provided by embodiment of the present disclosure, the subcircuit configured to control the potential of the first node is not provided with a diode, but is merely composed of a transistor, which not only simplifies the process for manufacturing the sensor pixel, but also reduces the cost of the sensor pixel.

Figure 9:
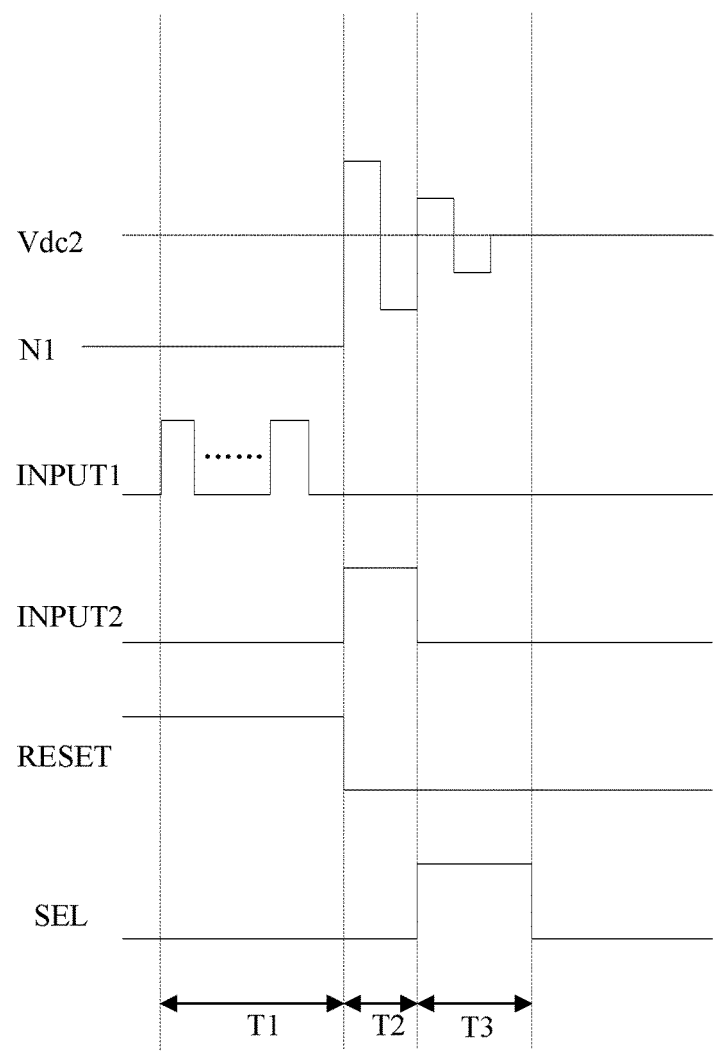
FIG. 9 is a timing chart showing the operation of the sensor pixel circuit provided in FIG. 8.

In an example, the transistors M0 to M3 in the sensor pixel circuit provided by the embodiment of the present disclosure are all N-type thin-film transistors. FIG. 9 is a timing chart showing the operation of the sensor pixel circuit provided in FIG. 8. As shown in FIGS. 8 to 9, the sensor pixel circuit involved in the embodiments of the present disclosure includes: three switching transistors (M1, M2, and M3), one drive transistor (M0), three signal input terminals (RESET, INPUT1, and SEL), and one power terminal (VDD).

In the first stage T1 which is an emitting phase, the input signal of the reset signal terminal RESET is at a high level. The first switching transistor M1 is turned on under the control of the reset signal terminal RESET, and the signal of the second signal input terminal INPUT2 is provided to the first node N1, such that the second electrode 22 of the piezoelectric transducer 20 is loaded with a fixed voltage. The signal of the first signal input terminal INPUT1 is an AC voltage, such that the first electrode 21 of the piezoelectric transducer 20 is loaded with an AC voltage. As the first electrode 21 is loaded with an AC voltage and the second electrode 22 is loaded with a fixed voltage, the piezoelectric material layer 23 generates an ultrasonic signal.

In the second stage T2 which is a receiving phase, the input signal of the reset signal terminal RESET is at a low level. The first switching transistor M1 is turned off under the control of the reset signal terminal RESET, and the input signal of the first signal input terminal INPUT1 is a fixed voltage, such that the first electrode 21 of the piezoelectric transducer 20 is loaded with a fixed voltage. At this time, the piezoelectric material layer 23 can receive the ultrasonic signal. An AC signal is generated on the second electrode 22 due to the positive piezoelectric effect of the piezoelectric material layer 23. The signal of the second signal input terminal INPUT2 is at a high level. The second switching transistor M2 is turned on under the control of the second signal input terminal INPUT2 to further increase the potential of the first node N1, such that the signal of the first node N1 is a single direction DC signal. At this time, it is assumed that the amplitude of the AC signal is Vdata, the DC level of the first node N1 satisfies Vdc2=V2+½Vdata, and V2 is the voltage of the input signal of the second signal input terminal INPUT2, the drive transistor M0 is in an on state. Since the input signal of the read signal terminal SEL is at a low level and the third switching transistor M3 is turned off, the signal of the source electrode of the drive transistor M0 is not output to the signal read line, and the fingerprint information will not be determined by the external detecting unit based on the electrical signal in the signal read line.

It should be noted that the voltage value V2 of the input signal of the second signal input terminal INPUT2 should ensure that the drive transistor M0 operates in the saturation region, that is, to ensure that the drive transistor M0 is turned on.

In the third stage T3 which is a reading stage, in order to avoid leakage of the second switching transistor M2, the input signal of the second signal input terminal INPUT2 is at a low level, the second switching transistor M2 is turned off, and the input signal of the read signal terminal SEL is at a high level. The third switching transistor M3 is turned on, and supplies the source signal of the drive transistor M2 to the signal read line Readline.

In this embodiment, in the second phase T2 and the third phase T3, since the ultrasonic signal has stopped emitting, the AC signal generated by the second electrode 22 will gradually become smaller and smaller due to the damping effect, and finally the potential of the first node N1 will be equal to Vdc2. Since Vdc2 includes Vdata, Vdata reflects the amplitude of the AC signal, and the amplitude of the AC signal depends on the fingerprint information, the purpose of fingerprint detection can be achieved by the detection of Vdc2.

For example, the drive transistor M0 is a gate voltage control type device.

It should be noted that the sensor pixel circuit in the embodiment of the present disclosure adopts the row and column read mode. When an ON signal is input to the read signal terminal SEL, the second switching transistor M2 is turned on. The signal read line Readline corresponding to the column used reads the signal, and then the second switching transistor M2 of the next row is turned on, and so on.

Further, as for the sensor pixel circuits provided in FIGS. 4, 6 and 8, since the frequency of the ultrasonic signal generated by the piezoelectric transducer is high and generally between several megahertz and several tens of megahertz, the coupling capacitance between the signal read line Readline and the second electrode 22 is relatively large. When calculated by only 100 rows, the capacitance between one signal read line Readline and the second electrode 22 is close to the Pf level, and the converted impedance is only a few K to several tens of K, such that most of the reflected ultrasonic signals are directly coupled to the signal read line Readline without going through the drive transistor M0 and the third switching transistor M3. Thus, the third switching transistor M3 becomes invalid, and the noise in the sensor pixel circuit increases due to the coupling of a large number of signals.

Figure 10:
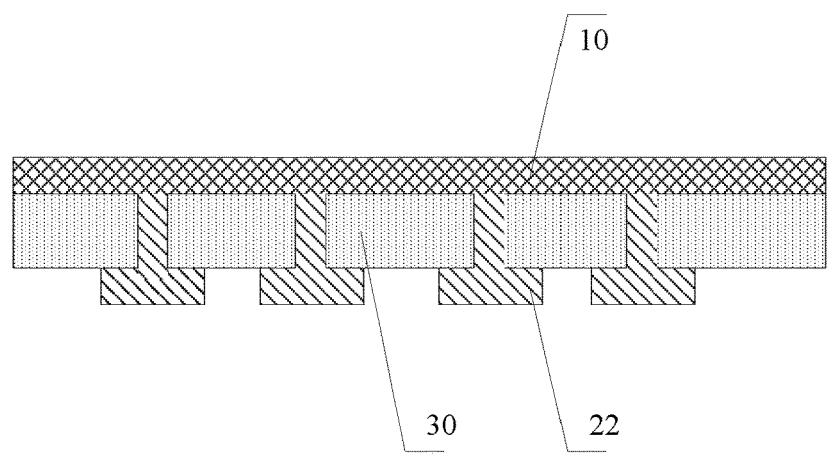
FIG. 10 is a sectional view I of a sensor pixel according to an embodiment of the present disclosure.

In order to ensure that the high-frequency ultrasonic signal is not directly coupled to the signal read line Readline, the AC detection is feasible. FIG. 10 is a sectional view I of a sensor pixel according to an embodiment of the present disclosure. As shown in FIG. 10, the sensor pixel provided by the embodiments of the present disclosure further includes a first insulating layer 30.

For example, the first insulating layer 30 is arranged on a side of the second electrode 22 proximate to the sensor pixel circuit 10; and the first insulating layer 30 is provided with a first via hole, and the second electrode 22 is connected to the sensor pixel circuit 10 through the first via hole.

Optionally, the first insulating layer 30 has a thickness of 2 to 4 micrometers.

In this embodiment, as shown in FIG. 10, the second electrode 22 may include a plurality of sub-electrodes arranged in a lateral direction or a longitudinal direction, which is not limited in this embodiment of the present disclosure.

In the embodiment of the present disclosure, the distance between the second electrode of the piezoelectric transducer and the signal read line Readline is increased by adding a first insulating layer in the sensor pixel, to reduce the coupling capacitance between the signal read line Readline and the second electrode 22, thereby reducing the noise of the sensor pixels.

Figure 11:
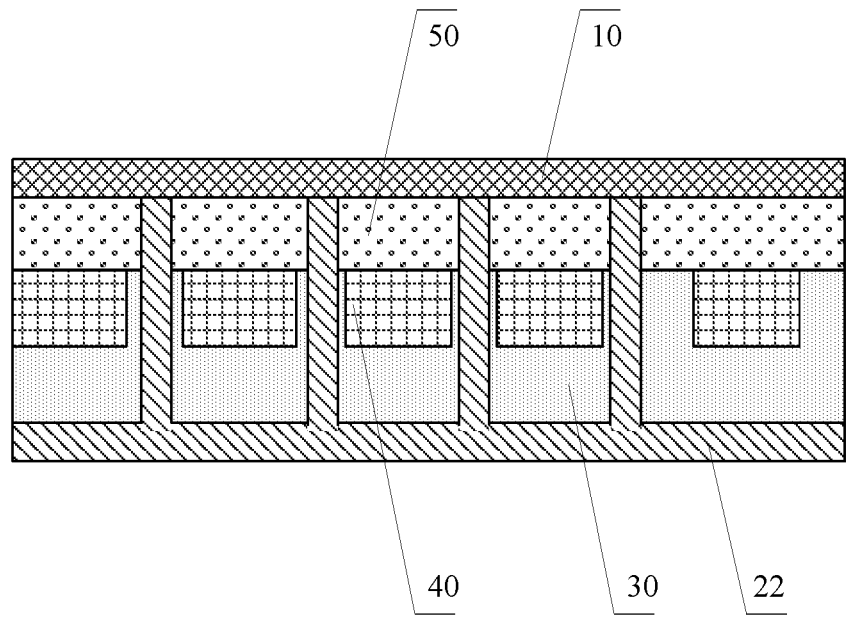
FIG. 11 is a sectional view II of a sensor pixel according to an embodiment of the present disclosure.

Optionally, in order to further reduce the coupling capacitance between the signal read line Readline and the second electrode 22, FIG. 11 is a sectional view II of a sensor pixel according to an embodiment of the present disclosure. As shown in FIG. 11, the sensor pixel provided by embodiment of the present disclosure further includes a shielding layer 40 and a second insulating layer 50.

For example, the shielding layer 40 is arranged on a side of the first insulating layer 30 away from the second electrode 22; and the second insulating layer 50 is arranged on a side of the shielding layer 40 away from the second electrode 22.

Among them, the shielding layer 40 is provided with a second via hole, the second insulating layer 50 is provided with a third via hole, and the second electrode 22 is connected to the sensor pixel circuit 10 through the first via hole, the second via hole and the third via hole.

In this embodiment, in order to prevent the shielding layer from contacting the second electrode of the piezoelectric transducer, the orthogonal projection of the first insulating layer 30 on the base substrate covers the orthogonal projection of the shielding layer 40 on the base substrate.

Optionally, the material of the second insulating layer 50 may include an organic material or an inorganic material, which is not limited in the embodiments of the present disclosure.

Figure 12:
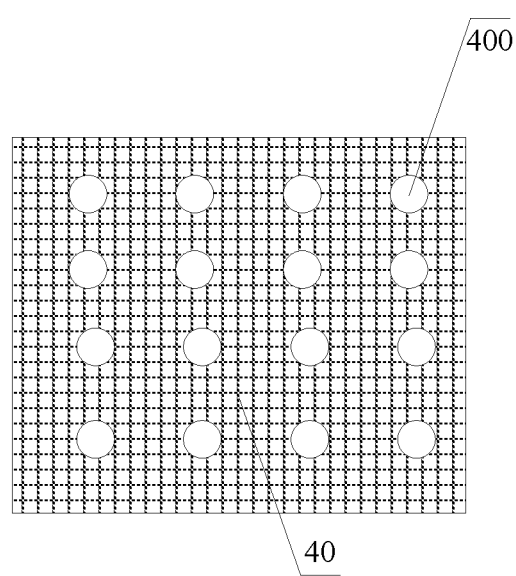
FIG. 12 is a top view I showing a shielding layer according to an embodiment of the present disclosure.

As an embodiment, when the second insulating layer 50 is made of an inorganic material such as silicon oxide, silicon nitride or a composite of silicon oxide and silicon nitride, the shielding layer 40 is made of a low-resistance metal material, for example, silver or aluminum. FIG. 12 is a top view I showing a shielding layer according to an embodiment of the present disclosure, in which the shielding layer 40 is provided with a second via hole 400.

Figure 13:
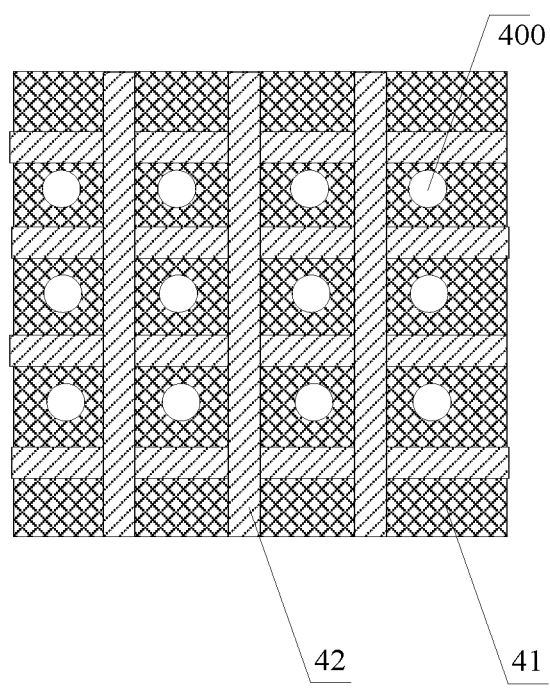
FIG. 13 is a top view II showing a shielding layer according to an embodiment of the present disclosure.

As another embodiment, when the second insulating layer 50 includes an organic material such as polyimide or the like, since the low-resistance metal material is difficult to be formed on the organic material, as shown in FIG. 13 which is a top view II showing a shielding layer according to an embodiment of the present disclosure, the shielding layer provided by the embodiment of the present disclosure includes a first conductive layer 41 and a second conductive layer 42.

For example, the first conductive layer 41 is arranged on a side of the second conductive layer 42 proximate to the second insulating layer 50.

Optionally, the resistivity of the second conductive layer 42 is smaller than that of the first conductive layer 41. The material of the second conductive layer 42 includes a low-resistance metal material, such as silver or aluminum, which is not limited in the embodiments of the present disclosure.

Optionally, the material of the first conductive layer 41 may be a transparent conductive material such as indium tin oxide, zinc tin oxide or the like. For example, the first conductive layer 41 is provided with a second via hole 400.

Optionally, as shown in FIG. 13, the second conductive layer 42 is of a mesh structure. For example, the orthogonal projection of the second conductive layer 42 on the base substrate does not overlap the orthogonal projection of the second via hole 400 on the base substrate.

The shielding layer provided by the embodiment of the invention includes a second conductive layer formed on the first conductive layer, which can reduce the resistance of the shielding layer.

The embodiment of the invention is based on the principle of ultrasonic detection, eliminates the design of diode in the original sensor pixel circuit structure, simplifies the process, rejects the DC detection mode in the original design and adopts an AC detection mode, and adds an insulating layer and/or a shielding layer between the second electrode of the piezoelectric transducer and the sensor pixel circuit, such that the high-frequency AC signal is not directly coupled to the signal read line Readline, thereby making the AC detection feasible.

Embodiment 2

Based on the inventive concept of the foregoing embodiments, an embodiment of the present disclosure further provides an ultrasonic sensor including a plurality of sensor pixels.

Among them, the sensor pixel is the sensor pixel provided in Embodiment 1, and the implementation principle and the implementation effect thereof are similar, and will not be reiterated herein.

Embodiment 3

Based on the inventive concept of the foregoing embodiments, an embodiment of the present disclosure further provides an OLED display panel. The OLED display panel provided by the embodiment of the present disclosure includes an OLED device layer arranged on a base substrate and an ultrasonic sensor.

Optionally, in the embodiment of the present disclosure, the ultrasonic sensor may be located on the same side of the base substrate as the OLED device layer, and may also be located on different sides. This not only can realize the display of the OLED display panel, but also can achieve fingerprint identification.

Optionally, as an embodiment, the ultrasonic sensor is arranged on a side of the base substrate proximate to the OLED device layer; and the sensor pixel is further configured to drive the OLED device layer to emit light. In this embodiment, the ultrasonic sensor is integrated in the OLED display panel, and the integration degree is relatively high.

Optionally, as another embodiment, the ultrasonic sensor is arranged on a side of the base substrate away from the OLED device layer. The integration degree of the embodiment is relatively low, and the ultrasonic sensor is placed under the entire OLED display panel and is implemented by using a plug-in method.

The ultrasonic sensor provided by the embodiment of the present disclosure is the ultrasonic sensor provided in Embodiment 2, and the implementation principle and the implementation effect thereof are similar, and will not be reiterated herein.

Embodiment 4

Based on the inventive concept of the foregoing embodiments, an embodiment of the present disclosure further provides a display device, including the above OLED display panel provided by Embodiment 3 of the present disclosure.

For example, the display device may be a mobile phone, a tablet computer, a television, a display, a notebook computer, a digital photo frame, a navigator, or any product or component having a display function. Other essential components of the display device may be included which should be understood by those skilled in the art, and thus will not be reiterated herein, nor should be construed as limiting the present disclosure. As for the implementation of the display device, reference may be made to the above embodiment of the embedded touch panel, and thus will not be reiterated herein.

The drawings of the embodiments in the present disclosure relate only to the structures involved in the embodiments of the present disclosure, and general designs may be referred as for other structures.

For the sake of clarity, the thickness and size of the layers or microstructures may be exaggerated in the drawings for describing embodiments of the invention. It will be understood that when an element, such as a layer, film, region, or substrate, is referred to as being "on" or "under" another element, the element may be directly "on" or "under" another element, or there may be an intermediate element.

The embodiments in the disclosure and the features in the embodiments can be combined with each other, as long as they do not contradict with each other.

The embodiments disclosed in the present disclosure are as described above, but they are merely used to facilitate the understanding of the embodiments of the present disclosure, and are not intended to limit the embodiments of the present disclosure. Any modification and variation in the form and details of the embodiments may be made by a person skilled in the art without departing from the spirit and scope of the embodiments of the present disclosure. The scope of patent protection is still subject to the scope defined by the appended claims.

What is claimed is:

1. A sensor pixel, comprising: a base substrate, a piezoelectric transducer arranged on the base substrate, and a sensor pixel circuit, wherein the piezoelectric transducer is connected to a first signal input terminal and a first node, the sensor pixel circuit comprises a node control subcircuit, a drive subcircuit and a read subcircuit;
    the node control subcircuit is connected to the first node, a reset signal terminal and a second signal input terminal, and is configured to control a signal of the first node according to a signal of the reset signal terminal and a signal of the second signal input terminal;
    the drive subcircuit is connected to the first node, a power terminal and a second node, and is configured to provide a detection signal to the second node under the control of the signal of the first node; and
    the read subcircuit is connected to the second node, a read signal terminal and a signal read line, and is configured to provide a signal of the second node to the signal read line under the control of the read signal terminal,
    wherein the piezoelectric transducer comprises a first electrode, a second electrode, and a piezoelectric material layer arranged between the first electrode and the second electrode; and the first electrode of the piezoelectric transducer is connected to the first signal input terminal, and the second electrode of the piezoelectric transducer is connected to the first node.

2. The sensor pixel of claim 1, wherein the piezoelectric material layer comprises polyvinyl difluoride (PVDF), aluminum nitride (AlN), or a lead zirconate titanate based composite oxide of a perovskite structure.

3. The sensor pixel of claim 1, wherein the first electrode and the second electrode of the piezoelectric transducer are of a multilayer conductive structure, each of which comprises a first metal layer made of titanium or molybdenum, a second metal layer made of aluminum, and a third metal layer made of titanium or molybdenum, the first metal layer is located on a side proximate to the base substrate, and the third metal layer is arranged between the first metal layer and the second metal layer.

4. The sensor pixel of claim 1, wherein the node control subcircuit comprises a first switching transistor and is not provided with a diode; and
    a control electrode of the first switching transistor is connected to the reset signal terminal, a first electrode of the first switching transistor is connected to the second signal input terminal, and a second electrode of the first switching transistor is connected to the first node.

5. The sensor pixel of claim 4, wherein the drive subcircuit comprises a drive transistor;
    a control electrode of the drive transistor is connected to the first node, a first electrode of the drive transistor is connected to the power terminal, and a second electrode of the drive transistor is connected to the second node;
    the read subcircuit comprises a third switching transistor; and
    a control electrode of the third switching transistor is connected to the read signal terminal, a first electrode of the third switching transistor is connected to the second node, and a second electrode of the third switching transistor is connected to the signal read line.

6. The sensor pixel of claim 1, wherein the node control subcircuit comprises a first switching transistor and a capacitor, and is not provided with a diode;
    a control electrode of the first switching transistor is connected to the reset signal terminal, a first electrode of the first switching transistor is connected to the second signal input terminal, and a second electrode of the first switching transistor is connected to the first node; and
    a first terminal of the capacitor is connected to the second signal input terminal, and a second terminal of the capacitor is connected to the first node.

7. The sensor pixel of claim 6, wherein the drive subcircuit comprises a drive transistor;
    a control electrode of the drive transistor is connected to the first node, a first electrode of the drive transistor is connected to the power terminal, and a second electrode of the drive transistor is connected to the second node;
    the read subcircuit comprises a third switching transistor; and
    a control electrode of the third switching transistor is connected to the read signal terminal, a first electrode of the third switching transistor is connected to the second node, and a second electrode of the third switching transistor is connected to the signal read line.

8. The sensor pixel of claim 1, wherein the node control subcircuit comprises a first switching transistor and a second switching transistor, and is not provided with a diode;
    a control electrode of the first switching transistor is connected to the reset signal terminal, a first electrode of the first switching transistor is connected to the second signal input terminal, and a second electrode of the first switching transistor is connected to the first node; and a control electrode and a first electrode of the second switching transistor are connected to the second signal input terminal, and a second electrode of the second switching transistor is connected to the first node.

9. The sensor pixel of claim 8, wherein the drive subcircuit comprises a drive transistor;
a control electrode of the drive transistor is connected to the first node, a first electrode of the drive transistor is connected to the power terminal, and a second electrode of the drive transistor is connected to the second node;
the read subcircuit comprises a third switching transistor; and
a control electrode of the third switching transistor is connected to the read signal terminal, a first electrode of the third switching transistor is connected to the second node, and a second electrode of the third switching transistor is connected to the signal read line.

10. The sensor pixel of claim 1, wherein the sensor pixel further comprises a first insulating layer arranged on the base substrate, wherein
the first insulating layer is arranged on a side of the second electrode of the piezoelectric transducer proximate to the sensor pixel circuit, and
the first insulating layer is provide with a first via hole, and the second electrode of the piezoelectric transducer is connected to the sensor pixel circuit through the first via hole.

11. The sensor pixel of claim 10, wherein the sensor pixel further comprises a shielding layer and a second insulating layer;
the shielding layer is arranged on a side of the first insulating layer away from the second electrode of the piezoelectric transducer; and
the second insulating layer is arranged on a side of the shielding layer away from the second electrode of the piezoelectric transducer; and the shielding layer is provided with a second via hole, the second insulating layer is provided with a third via hole, and the second electrode of the piezoelectric transducer is connected to the sensor pixel circuit through the first via hole, the second via hole and the third via hole.

12. The sensor pixel of claim 11, wherein the second insulating layer comprises an inorganic material, and the shielding layer comprises a low-resistance metal material.

13. The sensor pixel of claim 11, wherein the shielding layer comprises a first conductive layer and a second conductive layer; and
the first conductive layer is arranged on a side of the second conductive layer proximate to the second insulating layer.

14. The sensor pixel of claim 13, wherein the second insulating layer comprises an organic material, the first conductive layer comprises a transparent conductive material, and the second conductive layer comprises a low-resistance metal material.

15. The sensor pixel of claim 13, wherein a resistivity of the second conductive layer is smaller than a resistivity of the first conductive layer.

16. The sensor pixel of claim 13, wherein the second conductive layer is of a mesh structure; and
an orthogonal projection of the second conductive layer on the base substrate does not overlap an orthogonal projection of the second via hole on the base substrate.

17. An ultrasonic sensor, comprising a plurality of sensor pixels of claim 1.

18. An OLED display panel, comprising the ultrasonic sensor of claim 17.

19. An OLED display device, comprising the OLED display panel of claim 18.

* * * * *